United States Patent [19]

Tane et al.

[11] Patent Number: 5,528,077
[45] Date of Patent: Jun. 18, 1996

[54] FLEXIBLE TAB SEMICONDUCTOR DEVICE

[75] Inventors: Yasuo Tane, Urayasu; Jiro Nakano, Hadano; Jun-ichi Ohno, Yokohama, all of Japan

[73] Assignee: Kabushiki Kaisha Toshiba, Kawasaki, Japan

[21] Appl. No.: 399,992

[22] Filed: Mar. 6, 1995

Related U.S. Application Data

[63] Continuation of Ser. No. 213,576, Mar. 16, 1994, abandoned.

[30] Foreign Application Priority Data

Jun. 3, 1993 [JP] Japan .................................. 5-133187

[51] Int. Cl.⁶ ...................... H01L 23/495; H01L 23/498; H01L 29/41
[52] U.S. Cl. ...................... 257/666; 257/668; 257/669; 257/775
[58] Field of Search ..................................... 257/666, 668, 257/697, 669, 670, 671, 674, 688, 690, 691, 692, 701, 775, 773

[56] References Cited

U.S. PATENT DOCUMENTS

| | | | |
|---|---|---|---|
| 4,109,096 | 8/1978 | Dehaine | 257/668 |
| 4,801,999 | 1/1989 | Hayward et al. | 257/668 |
| 4,937,655 | 6/1990 | Miyazaki | 257/668 |
| 5,055,914 | 10/1991 | Shimizu et al. | 257/697 |
| 5,075,252 | 12/1991 | Schendelman | 257/668 |
| 5,168,345 | 12/1992 | Brossart | 257/668 |
| 5,275,897 | 1/1994 | Nagesh et al. | 257/666 |

FOREIGN PATENT DOCUMENTS

| | | |
|---|---|---|
| 0278754 | 11/1990 | Japan . |
| 0295143 | 12/1990 | Japan . |

*Primary Examiner*—Peter Toby Brown
*Attorney, Agent, or Firm*—Finnegan, Henderson, Farabow, Garrett & Dunner

[57] ABSTRACT

A TAB semiconductor device according to the present invention is as follows. One end of each lead whose direction is fixed by a TAB tape is connected to a corresponding electrode on a semiconductor pellet placed at a predetermined position of the TAB tape. The TAB tape is a tape having the thin leads fixed on a film and a portion where the film is removed, i.e., a window portion in a predetermined area. Only the arrangement of the leads is exposed to the window portion. A user arbitrarily cuts the leads in this area in accordance with mounting. The leads have normal signal leads and wider leads together. As for these wider leads, slits are provided to make the lead widths uniform throughout the window portion.

3 Claims, 4 Drawing Sheets

5,528,077

FLEXIBLE TAB SEMICONDUCTOR DEVICE

This application is a continuation of application Ser. No. 08/213,576 filed Mar. 16, 1994, now abandoned.

BACKGROUND OF THE INVENTION

1. Field of the Invention

The present invention relates to a semiconductor device using a TAB (tape automated bonding) technique and, more particularly, to a TAB tape capable of coping with mounting on various types of packages and printed circuit boards.

2. Description of the Related Art

In a TAB semiconductor device (TAB package), the resistance or inductance at a lead or bonding portion must be minimized, so that a lead such as a power supply and grounding lead which requires a large current is formed wider than a normal signal lead. That is, leads having a normal width and wider leads are fixed together on a TAB tape. When a device is to be mounted on a large package such as a PGA (pin grid array) by using this TAB package, outer leads of the TAB tape are connected to wiring patterns in the PGA package by the single point bonding method. At this time, the bonding conditions are different depending on lead widths. For this reason, bonding tools must be exchanged, or the bonding process is prolonged.

An arrangement to solve the above problem is disclosed in Jpn. Pat. Appln. KOKAI Publication No. 2-295143. According to this arrangement, the wider leads are divided at the bonding portions to have the same width as the normal leads. The same bonding conditions are thus obtained to make gang bonding possible.

The arrangement in the above prior art is as follows. Normal signal leads and wider leads are formed together on a TAB tape. The wider leads are divided at specific portions, where they are bonded with the internal terminals of a PGA package, to have the same width as the normal signal leads. Making the lead width uniform, the same bonding conditions can be obtained.

With the above arrangement, however, the wider leads remain wider in a device hole region. The device hole is a region where the leads are present without being supported by the TAB tape. In this region, the user cuts the leads of the TAB tape at an arbitrary length in mounting. If gang bonding is desired, the user must cut the leads while avoiding the portions where the wider leads are formed in the device hole region. Therefore, this arrangement poses a limit on free mounting by the user and does not cope with mounting in a wide range.

SUMMARY OF THE INVENTION

It is an object of the present invention to provide a semiconductor device in which the leads of a TAB tape can be cut at the same width in an arbitrary cutting area.

The object of the present invention can be achieved by the following arrangement.

A TAB semiconductor device comprises:

a semiconductor pellet having a plurality of electrodes arranged on a major surface;

a plurality of conductive leads formed on a film and each having one end connected to a corresponding one of the electrodes and the other end extending outside the semiconductor pellet;

lead arranging means provided with the leads in various shapes and having a slit for dividing midway at least one of the leads extending outside the semiconductor pellet; and window opening means in which the film is removed in correspondence with cutting areas of the leads to expose the lead arranging means, wherein the leads include a lead with the slit and have a uniform width throughout at least the window opening means.

According to the arrangement of the present invention, since the slits are formed throughout the window portion, a wider lead such as a power supply lead or the like, which requires a large current, and a normal lead have the same width in the window portion. Therefore, even when a user cuts the leads at arbitrary positions in the window portion, the width of each lead becomes uniform.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENTS

Figure 1:
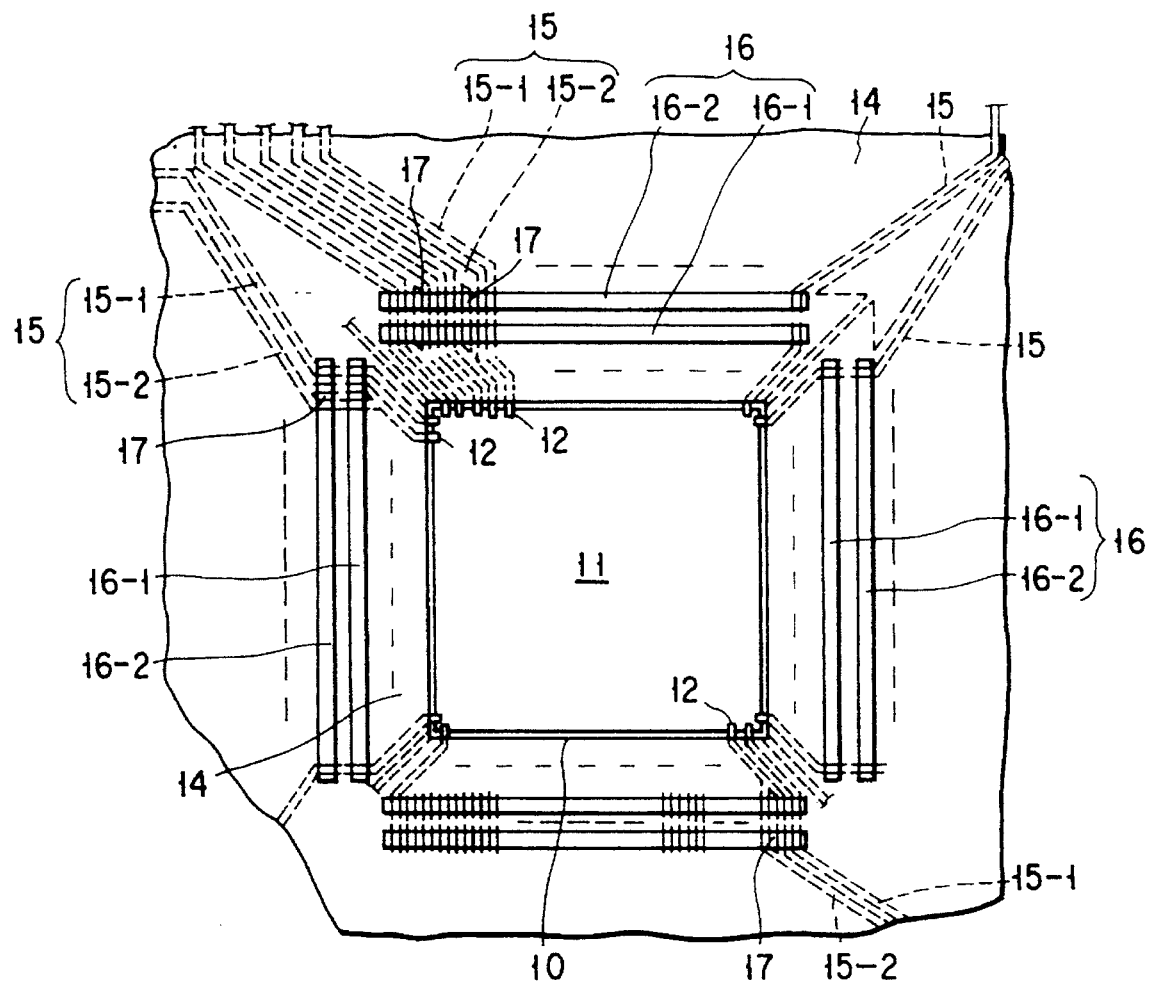
FIG. 1 is a plan view showing the arrangement of a TAB semiconductor device according to the first embodiment of the present invention.

FIG. 1 is a plan view showing the arrangement of a TAB semiconductor device according to the first embodiment of the present invention, in which the ILB (inner lead bonding) process for the semiconductor chip is completed. A semiconductor pellet 11 is placed on a device hole 10 of a film carrier. Each electrode 12 on the pellet 11 is connected to one end (inner lead) of a corresponding one of leads 15 whose directions are fixed by a TAB tape 14. In the TAB tape 14, for example, the thin conductive leads 15 are fixed on a polyimide film, and the polyimide film is removed from a predetermined region. This region where the polyimide film is removed is called a window portion 16 (16-1 and 16-2). In each window portion 16, only the arrangement of the leads 15 is exposed. The leads 15 are cut at arbitrary positions in the region of the window portion 16 in mounting by a user.

In the arrangement of the leads 15, normal signal leads 15-1 and divided leads 15-2 are formed together. The leads 15-2 are, for example, power supply or grounding leads having a larger width to reduce the resistance or inductance at the bonding portions in outer lead bonding to a package or substrate. The leads 15-2 are divided by slits 17 provided throughout the window portion 16. With this arrangement, the leads 15-1 and 15-2 have an uniform width in the window portion 16.

Figure 2:
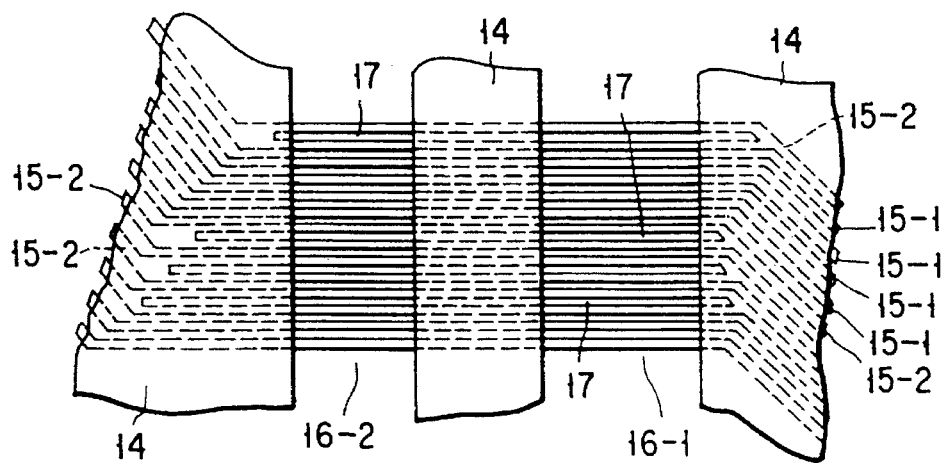
FIG. 2 is a plan view showing a TAB tape portion in FIG. 1 in more detail.

FIG. 2 is a view showing the leads 15-1 and 15-2 in the window portion 16 (16-1 and 16-2) in FIG. 1 in more detail. The wider leads 15-2 are divided by the slits 17 to obtain a uniform lead width in the window portion. A window portion 16-1 has a width of about 1 mm, and a window portion 16-2 has a width of about 0.8 mm. The user cuts the leads at arbitrary positions in the window portion 16, thereby completing a TAB package to cope with various types of mounting.

Figure 3:
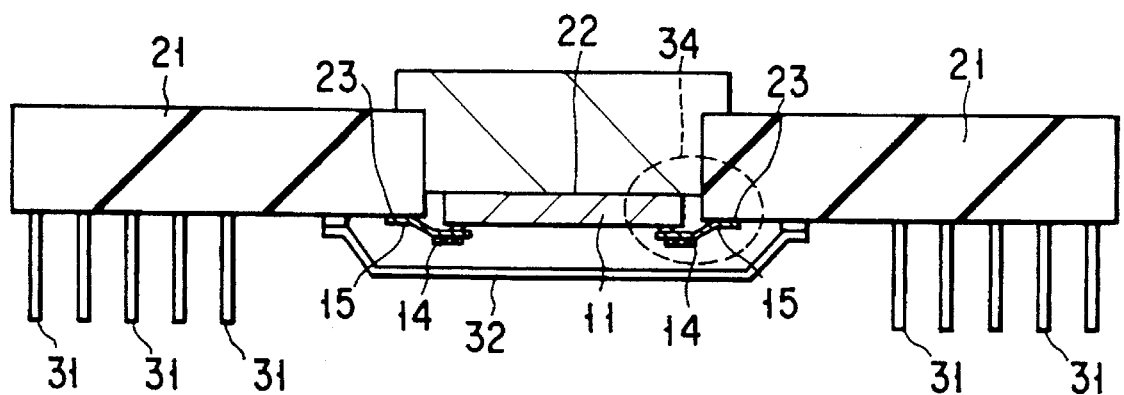
FIG. 3 is a sectional view showing the first application according to the first embodiment, in which the TAB package of the present invention is mounted on the first PGA package.

FIG. 3 is a sectional view showing the first application according to the first embodiment, in which the TAB package of the present invention is mounted on the first PGA (pin grid array) package. The semiconductor pellet 11 is mounted in a cavity portion 22 of a ceramic main body 21. The cavity portion 22 consists of CuW having a high thermal conductivity. The electrodes on the semiconductor pellet 11 are connected to the inner leads of the leads 15 of the TAB tape 14, respectively. The distal ends of the outer leads of the leads 15 are obtained by cutting the leads 15 at arbitrary positions in the window portion 16 at one time. The outer leads of the leads 15 are connected to predetermined terminals 23 connected to pins 31 of the ceramic main body 21. Reference numeral 32 denotes a protective cap.

Figure 4:
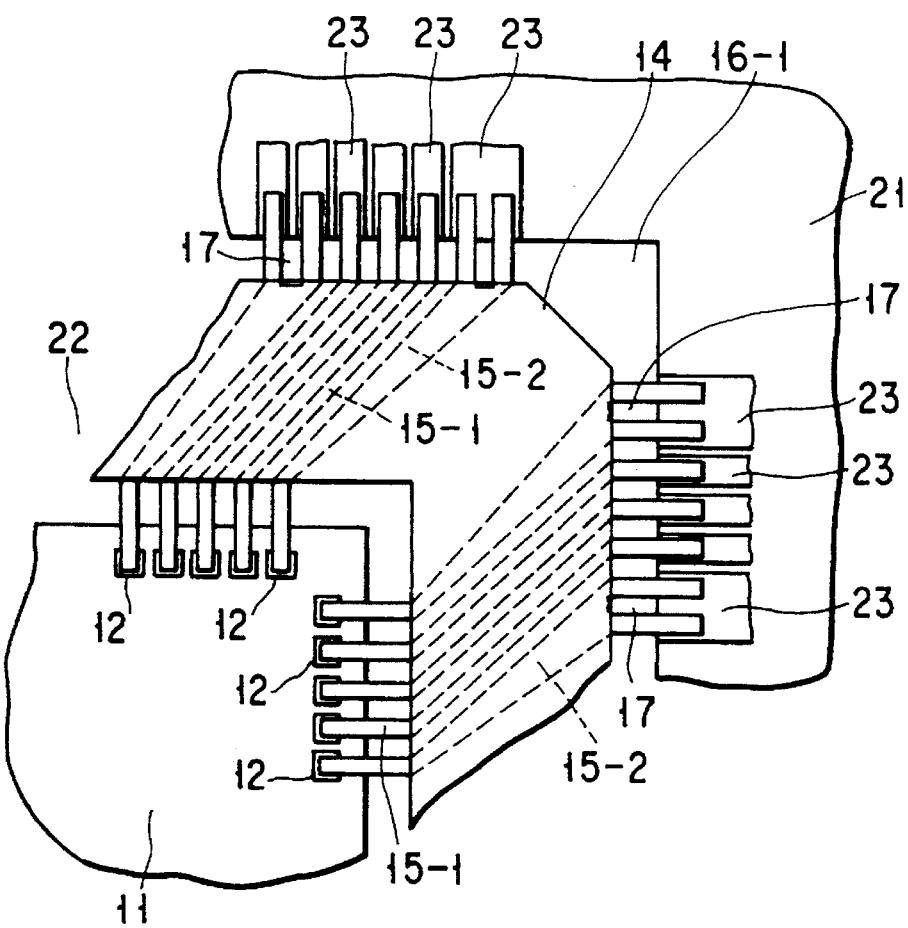
FIG. 4 is a plan view showing the main part in a broken line portion in FIG. 3.

FIG. 4 is a plan view showing the main part in a broken line portion 34 in FIG. 3. The leads are cut at arbitrary positions in the window portion 16-1 of the TAB tape 14 shown in FIG. 1. Since the slits 17 are formed, the wider leads 15-2 have the same width as the normal signal leads 15-2 and are bonded to the terminals 23 of the ceramic main body 21, respectively, as in the signal leads 15-1.

Figure 5:
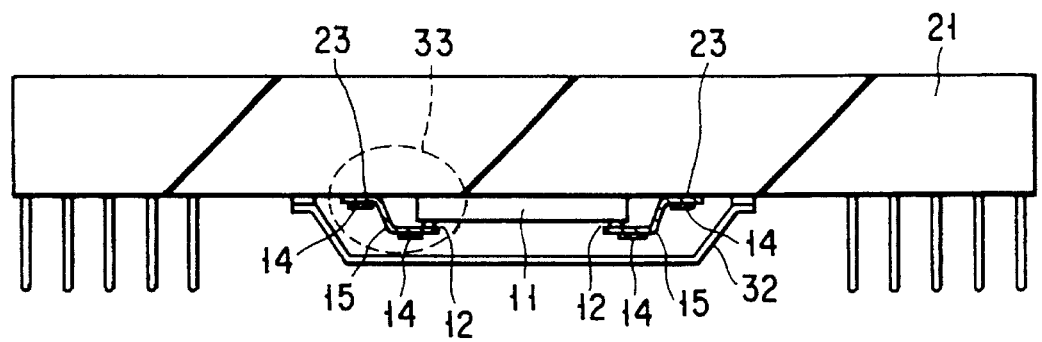
FIG. 5 is a sectional view showing the second application according to the first embodiment, in which the TAB package of the present invention is mounted on the second PGA package.

FIG. 5 is a sectional view showing the second application according to the first embodiment, in which the TAB package of the present invention is mounted on the second PGA (pin grid array) package. The semiconductor pellet 11 is mounted on the ceramic main body 21. The electrodes 12 on the semiconductor pellet 11 are connected to the inner leads of the leads 15 of the TAB tape 14, respectively. The distal ends of the outer leads of the leads 15 of the TAB tape 14 are obtained by cutting the leads 15 at arbitrary positions in the window portion 16-2. The outer leads of the leads 15 are connected to the predetermined terminals 23 connected to the pins of the semiconductor pellet 11. Reference numeral 32 denotes the protective cap.

Figure 6:
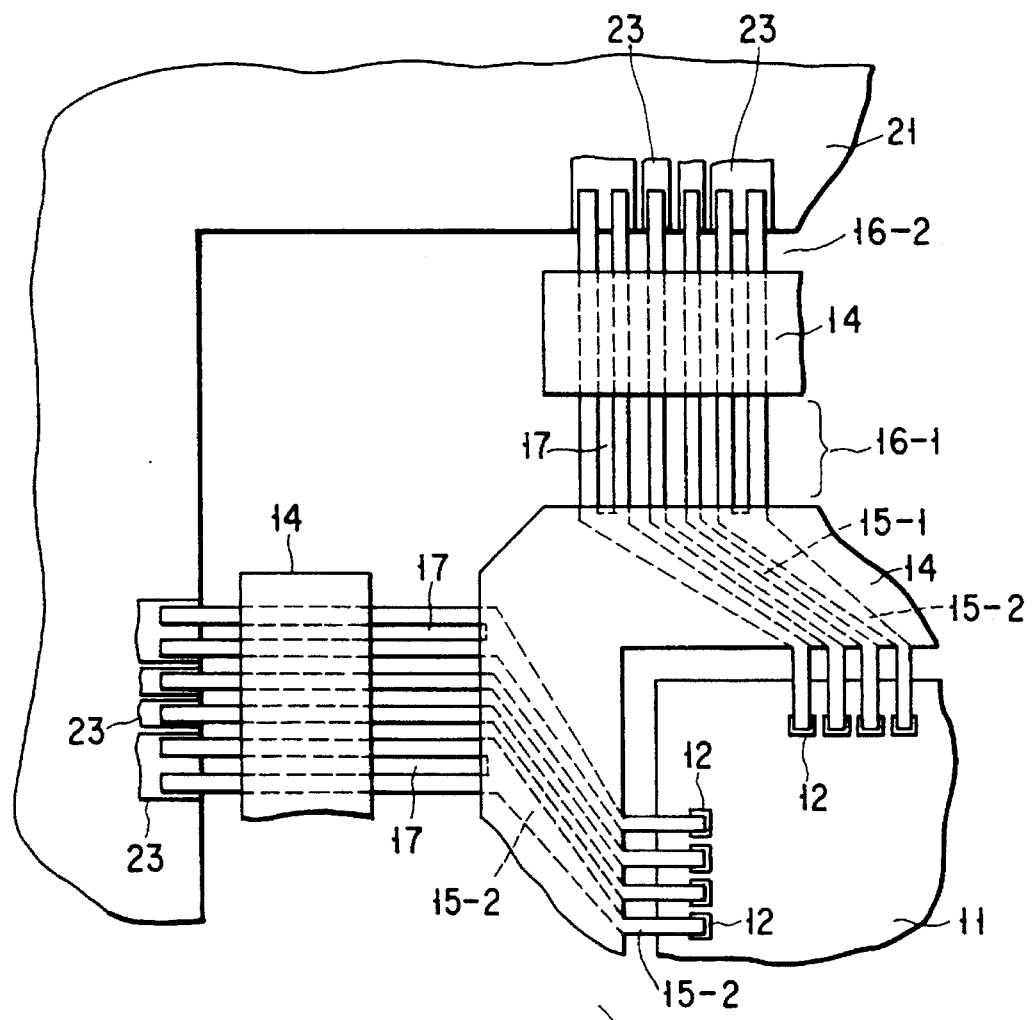
FIG. 6 is a plan view showing the main part in a broken line portion in FIG. 5.

FIG. 6 is a plan view showing the main part in a broken line portion 33 in FIG. 5. The leads 15 are cut at arbitrary positions in the window portion 16-2 of the TAB tape 4 shown in FIG. 1. Since the slits 17 are formed, the wider leads 15-2 have the same width as the normal signal leads 15-1 and are bonded to the terminals of the semiconductor pellet 11, respectively, as in the signal leads 15-1.

According to the arrangement of the above embodiment, since the slits 17 are formed throughout the window portion, the wider leads 15-2 such as power supply and grounding leads used for a large current and the normal signal leads 15-1 have the same width in the window portion 16. For this reason, the user can cut the leads at arbitrary positions in the window portion to cope with mounting in a wide range.

Figure 7:
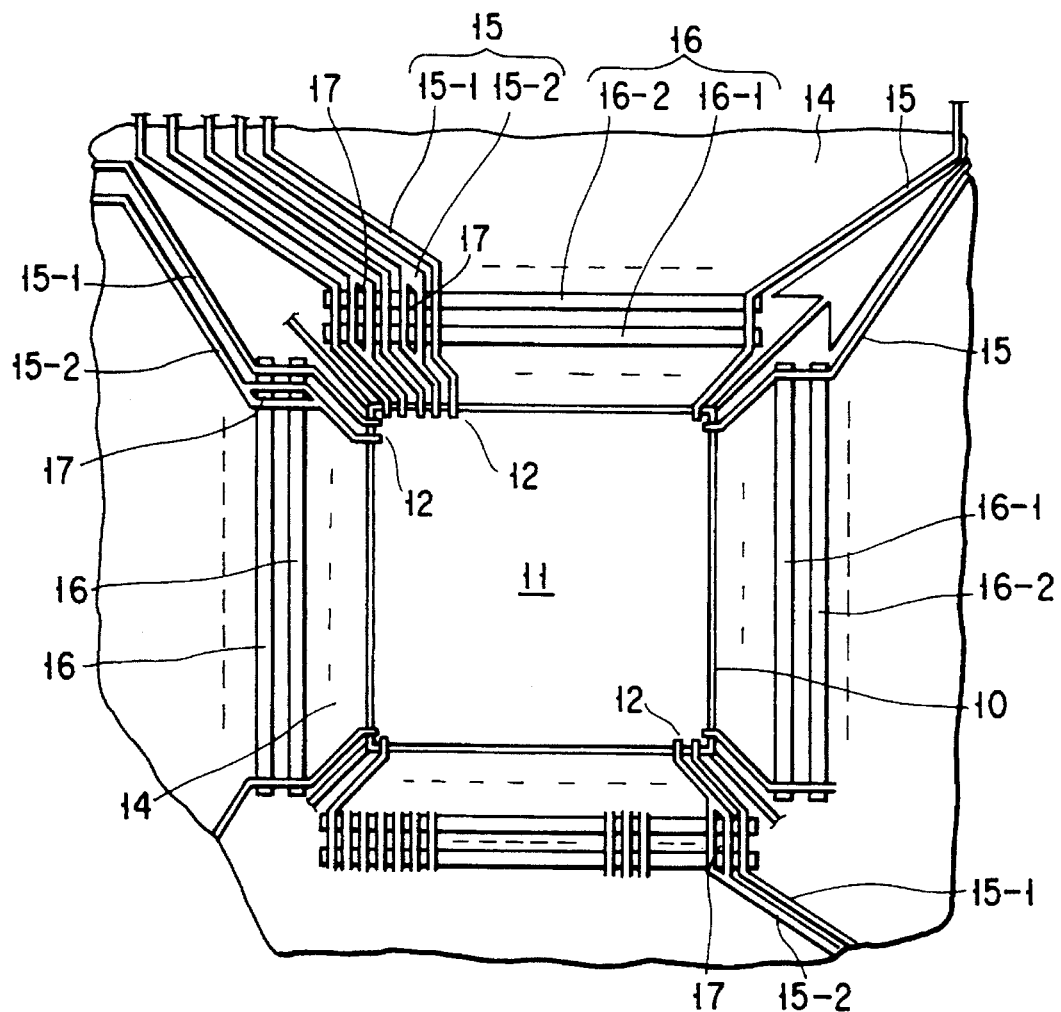
FIG. 7 is a plan view showing the arrangement of a TAB semiconductor device according to the second embodiment of the present invention.
Figure 8:
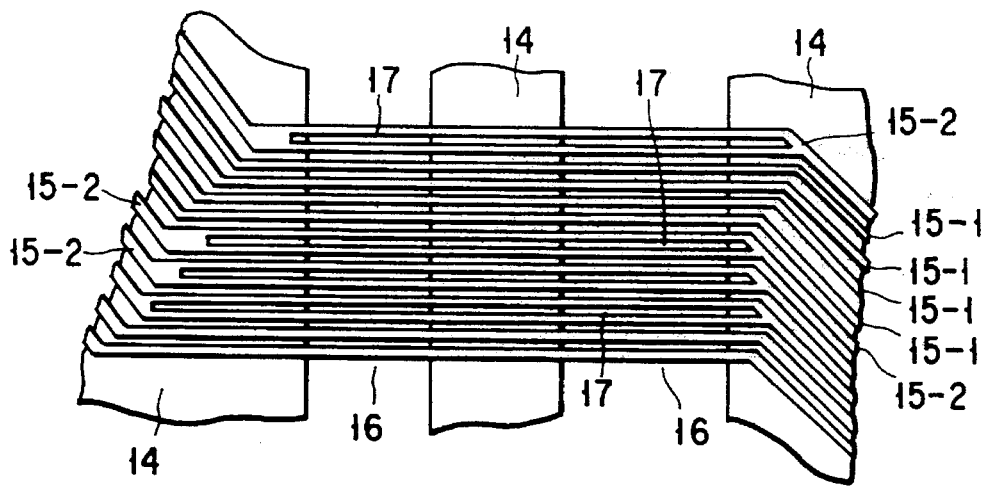
FIG. 8 is a plan view showing a TAB tape portion in FIG. 7 in more detail.

FIG. 7 is a plan view showing the arrangement of a TAB semiconductor device according to the second embodiment of the present invention, which is different from FIG. 1 in the fixing surface of a TAB tape 14. More specifically, leads 15 and TAB tape 14 are reversed in FIG. 7. FIG. 8 is a view showing leads 15-1 and 15-2 in a window portion 16 (16-1 and 16-2) in FIG. 7 in more detail. The wider leads 15-2 are divided by slits 17 to obtain a uniform lead width in the window portion 16. A user can cut the leads at arbitrary positions in the window portion 16, thereby completing a TAB package to cope with various types of mounting. With this arrangement, even after the TAB package is mounted on a substrate or the like, the arrangement state of the leads can be easily confirmed.

The embodiments described above are manufactured in the form of PGA packages. Nevertheless, the present invention can be applied to any other types of packages, such as QFPs (quad flat package), BGAs (ball grid array), LGAs (lead grid array) and the like.

Furthermore, the present invention can be applied to wiring boards, as well, such as PWBs (print wiring board).

As has been described above, according to the present invention, since the slits are formed throughout the window portion, a uniform lead width can be obtained in the window portion. Therefore, the user can cut the leads at arbitrary positions in the window portion, thereby obtaining a semiconductor device capable of coping with mounting in a wide range.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A TAB semiconductor device comprising:
   a semiconductor pellet having a plurality of electrodes arranged on a major surface;
   a plurality of first conductive leads formed on a TAB film and each having one end connected to a corresponding one of said electrodes and the other end extending outside said semiconductor pellet;
   plurality of second conductive leads formed on said TAB film and each having one end connected to a corresponding one of said electrodes and the other end extending outside said semiconductor pellet, each of said second conductive leads having a slit which divides each of said second conductive leads into two lead portions each having the same width as each of said first conductive leads and extending in parallel to said first conductive leads; and
   window opening means in which said TAB film is removed in correspondence with at least two cutting areas disposed in longitudinally spaced relation along each of said first and second conductive leads,
   wherein in each of said at least two cutting areas, said first conductive leads and said lead portions of said second conductive leads are arranged at a uniform spacing.

2. A TAB tape comprising:

a device hole for placing a semiconductor device;

a plurality of first conductive leads formed on a TAB film each having one end exposed to said device hole and another end extending outside said device hole;

a plurality of second conductive leads formed on said TAB film each having one end exposed to said device hole and the other end extending outside said device hole, each of said second conductive leads having a slit which divides each of said second conductive leads into two lead portions each having the same width as each of said first conductive leads and extending in parallel to said first conductive leads; and window opening means in which said TAB film is removed in correspondence with at least two cutting areas disposed in longitudinally spaced relation along each of said first and second conductive leads, wherein in each of said cutting areas, said first conductive leads and said lead portions of said second conductive leads are arranged at a uniform spacing.

3. A semiconductor device comprising:

a ceramic base incorporating wiring and provided with terminals;

a semiconductor pellet having a plurality of electrodes arranged on a major surface;

a plurality of first conductive leads formed on a TAB film and each having one end connected to a corresponding one of said electrodes and another end extending outside said semiconductor pellet and connected to a corresponding one of said terminals;

a plurality of second conductive leads formed on said TAB film and each having one end connected to a corresponding one of said electrodes and another end extending outside said semiconductor pellet and connected to a corresponding one of said terminals, each of said second conductive leads having a slit dividing each of said second conductive leads into two lead portions, each having the same width as each of said first conductive leads, and extending in parallel to said first conductive leads; and window opening means in which said TAB film is removed in correspondence with at least two cutting areas disposed in longitudinally spaced relation along each of said first and second conductive lead, wherein in each of said at least two cutting areas, said first conductive leads and said lead portions of said second conductive leads are arranged at a uniform spacing and wherein each of said first conductive leads and said lead portions of said second conductive leads in said window opening means are respectively cut in one of said at least two cutting areas and connected to said corresponding terminals provided to said ceramic base, wherein at least one of said first conductive leads and said lead portions of said second conductive leads extends through a first cutting area and into a second cutting area where it is cut and connected to a corresponding terminal on the ceramic base.

* * * * *